(12) United States Patent
Griebenow et al.

(10) Patent No.: US 8,017,504 B2
(45) Date of Patent: Sep. 13, 2011

(54) TRANSISTOR HAVING A HIGH-K METAL GATE STACK AND A COMPRESSIVELY STRESSED CHANNEL

(75) Inventors: Uwe Griebenow, Markkleeberg (DE); Jan Hoentschel, Dresden (DE); Kai Frohberg, Niederau (DE)

(73) Assignee: Globalfoundries Inc., Grand Cayman (KY)

( * ) Notice: Subject to any disclaimer, the term of this patent is extended or adjusted under 35 U.S.C. 154(b) by 70 days.

(21) Appl. No.: 12/552,548

(22) Filed: Sep. 2, 2009

(65) Prior Publication Data

US 2010/0078653 A1   Apr. 1, 2010

(30) Foreign Application Priority Data

Sep. 30, 2008   (DE) .................... 10 2008 049 717

(51) Int. Cl.
 *H01L 21/20* (2006.01)
(52) U.S. Cl. ........ 438/478; 438/483; 438/498; 438/590; 438/752; 438/933; 427/255.35; 427/577; 427/590; 427/122; 427/249.1; 427/249.15; 257/19; 257/E33.009; 257/E31.035; 257/E29.104; 257/E21.093; 257/E21.102; 257/E21.182; 257/E21.207; 257/77; 257/E21.066
(58) Field of Classification Search .......... None
 See application file for complete search history.

(56) References Cited

U.S. PATENT DOCUMENTS

| 6,818,938 B1 * | 11/2004 | Naem ........................ 257/302 |
| 2006/0019462 A1 * | 1/2006 | Cheng et al. ................. 438/400 |
| 2006/0148143 A1 | 7/2006 | Bedell et al. ................. 438/162 |

FOREIGN PATENT DOCUMENTS

| DE | 102004033149 A1 | 2/2006 |
| EP | 1 672 700 A2 | 6/2006 |

OTHER PUBLICATIONS

Ilicali et al. (DE 10-2004-033149), the machine translation version of the German document.*
Translation of Official Communication from German Patent Office for German Patent Application No. 10 2008 049 717.7 dated Apr. 23, 2009.

* cited by examiner

*Primary Examiner* — Charles Garber
*Assistant Examiner* — Yasser Abdelaziez
(74) *Attorney, Agent, or Firm* — Williams, Morgan & Amerson, P.C.

(57) ABSTRACT

In a manufacturing flow for adapting the band gap of the semiconductor material with respect to the work function of a metal-containing gate electrode material, a strain-inducing material may be deposited to provide an additional strain component in the channel region. For instance, a layer stack with silicon/carbon, silicon and silicon/germanium may be used for providing the desired threshold voltage for a metal gate while also providing compressive strain in the channel region.

12 Claims, 4 Drawing Sheets

TRANSISTOR HAVING A HIGH-K METAL GATE STACK AND A COMPRESSIVELY STRESSED CHANNEL

BACKGROUND OF THE INVENTION

1. Field of the Invention

Generally, the present disclosure relates to sophisticated integrated circuits including advanced transistor elements that comprise highly capacitive gate structures including a metal-containing electrode and a high-k gate dielectric of increased permittivity compared to gate dielectrics, such as silicon dioxide and silicon nitride.

2. Description of the Related Art

The fabrication of advanced integrated circuits, such as CPUs, storage devices, ASICs (application specific integrated circuits) and the like, requires the formation of a large number of circuit elements on a given chip area according to a specified circuit layout, wherein field effect transistors represent one important type of circuit element that substantially determine performance of the integrated circuits. Generally, a plurality of process technologies are currently practiced, wherein, for many types of complex circuitry, including field effect transistors, MOS technology is currently one of the most promising approaches due to the superior characteristics in view of operating speed and/or power consumption and/or cost efficiency. During the fabrication of complex integrated circuits using, for instance, MOS technology, millions of transistors, e.g., N-channel transistors and/or P-channel transistors, are formed on a substrate including a crystalline semiconductor layer. A field effect transistor, irrespective of whether an N-channel transistor or a P-channel transistor is considered, typically comprises so-called PN junctions that are formed by an interface of highly doped regions, referred to as drain and source regions, with a slightly doped or non-doped region, such as a channel region, disposed adjacent to the highly doped regions. In a field effect transistor, the conductivity of the channel region, i.e., the drive current capability of the conductive channel, is controlled by a gate electrode formed adjacent to the channel region and separated therefrom by a thin insulating layer. The conductivity of the channel region, upon formation of a conductive channel due to the application of an appropriate control voltage to the gate electrode, depends on the dopant concentration, the mobility of the charge carriers and, for a given extension of the channel region in the transistor width direction, on the distance between the source and drain regions, which is also referred to as channel length. Hence, in combination with the capability of rapidly creating a conductive channel below the insulating layer upon application of the control voltage to the gate electrode, the conductivity of the channel region substantially affects the performance of MOS transistors. Thus, as the speed of creating the channel, which depends on the conductivity of the gate electrode, and the channel resistivity substantially determine the transistor characteristics, the scaling of the channel length, and associated therewith the reduction of channel resistivity and increase of gate resistivity, is a dominant design criterion for accomplishing an increase in the operating speed of the integrated circuits.

Presently, the vast majority of integrated circuits are based on silicon due to substantially unlimited availability, the well-understood characteristics of silicon and related materials and processes and the experience gathered during the last 50 years. Therefore, silicon will likely remain the material of choice for future circuit generations designed for mass products. One reason for the dominant importance of silicon in fabricating semiconductor devices has been the superior characteristics of a silicon/silicon dioxide interface that allows reliable electrical insulation of different regions from each other. The silicon/silicon dioxide interface is stable at high temperatures and, thus, allows the performance of subsequent high temperature processes, as are required, for example, for anneal cycles to activate dopants and to cure crystal damage without sacrificing the electrical characteristics of the interface.

For the reasons pointed out above, in field effect transistors, silicon dioxide is preferably used as a gate insulation layer that separates the gate electrode, frequently comprised of polysilicon or other metal-containing materials, from the silicon channel region. In steadily improving device performance of field effect transistors, the length of the channel region has continuously been decreased to improve switching speed and drive current capability. Since the transistor performance is controlled by the voltage supplied to the gate electrode to invert the surface of the channel region to a sufficiently high charge density for providing the desired drive current for a given supply voltage, a certain degree of capacitive coupling, provided by the capacitor formed by the gate electrode, the channel region and the silicon dioxide disposed therebetween, has to be maintained. It turns out that decreasing the channel length requires an increased capacitive coupling to avoid the so-called short channel behavior during transistor operation. The short channel behavior may lead to an increased leakage current and to a dependence of the threshold voltage on the channel length. Aggressively scaled transistor devices with a relatively low supply voltage and thus reduced threshold voltage may suffer from an exponential increase of the leakage current while also requiring enhanced capacitive coupling of the gate electrode to the channel region. Thus, the thickness of the silicon dioxide layer has to be correspondingly decreased to provide the required capacitance between the gate and the channel region. For example, a channel length of approximately 0.08 μm may require a gate dielectric made of silicon dioxide as thin as approximately 1.2 nm. Although, generally, high speed transistor elements having an extremely short channel may preferably be used for high speed applications, whereas transistor elements with a longer channel may be used for less critical applications, such as storage transistor elements, the relatively high leakage current caused by direct tunneling of charge carriers through an ultra-thin silicon dioxide gate insulation layer may reach values for an oxide thickness in the range of 1-2 nm that may no longer be compatible with requirements for performance driven circuits.

Therefore, replacing silicon dioxide as the material for gate insulation layers has been considered, particularly for extremely thin silicon dioxide gate layers. Possible alternative materials include materials that exhibit a significantly higher permittivity so that a physically greater thickness of a correspondingly formed gate insulation layer provides a capacitive coupling that would be obtained by an extremely thin silicon dioxide layer. Commonly, a thickness required for achieving a specified capacitive coupling with silicon dioxide is referred to as capacitance equivalent thickness (CET). Thus, at a first glance, it appears that simply replacing the silicon dioxide with high-k materials is a straightforward way to obtain a capacitance equivalent thickness in the range of 1 nm and less.

It has been thus suggested to replace silicon dioxide with high permittivity materials such as tantalum oxide ($Ta_2O_5$) with a k of approximately 25, strontium titanium oxide (Sr-$TiO_3$) having a k of approximately 150, hafnium oxide ($HfO_2$), HfSiO, zirconium oxide ($ZrO_2$), and the like.

When advancing to sophisticated gate architecture based on high-k dielectrics, additionally, transistor performance may be increased by providing an appropriate conductive material for the gate electrode to replace the usually used polysilin material, since polysilicon may suffer from charge carrier depletion at the vicinity of the interface to the gate dielectric, thereby reducing the effective capacitance between the channel region and the gate electrode. Thus, a gate stack has been suggested in which a high-k dielectric material provides enhanced capacitance when formed with the same thickness as a silicon dioxide layer, while additionally maintaining leakage currents at an acceptable level. On the other hand, the non-polysilicon material, such as titanium nitride and the like, may be formed so as to connect to the high-k dielectric material, thereby substantially avoiding the presence of a depletion zone. Since, typically, a low threshold voltage of the transistor, which represents the voltage at which a conductive channel forms in the channel region, is desired to obtain the high drive currents, commonly, the controllability of the respective channel requires pronounced lateral dopant profiles and dopant gradients, at least in the vicinity of the PN junctions. Therefore, so-called halo regions are usually formed by ion implantation in order to introduce a dopant species whose conductivity type corresponds to the conductivity type of the remaining channel and semiconductor region to "reinforce" the resulting PN junction dopant gradient after the formation of respective extension and deep drain and source regions. In this way, the threshold voltage of the transistor significantly determines the controllability of the channel, wherein a significant variance of the threshold voltage may be observed for reduced gate lengths. Hence, by providing an appropriate halo implantation region, the controllability of the channel may be enhanced, thereby also reducing the variance of the threshold voltage, which is also referred to as threshold roll off, and also reducing significant variations of transistor performance with a variation in gate length. Since the threshold voltage of the transistors is significantly determined by the work function of the metal-containing gate material, an appropriate adjustment of the effective work function with respect to the conductivity type of the transistor under consideration has to be guaranteed.

For example, appropriate metal-containing gate electrode materials, such as titanium nitride and the like, may frequently be used, wherein the corresponding work function may be adjusted to be appropriate for one type of transistor, such as N-channel transistors, while P-channel transistors may require a different work function and thus a differently treated titanium nitride material or any other appropriate metal-containing material in order to obtain the desired threshold voltage. In this case, complex and sophisticated manufacturing regimes may be required to provide different gate electrode materials in order to comply with the requirements of different transistor types. For this reason, it has also been proposed to appropriately adjust the threshold voltage of transistor devices by providing a specifically designed semiconductor material at the interface between the high-k dielectric material and the channel region of the transistor device, in order to appropriately "position" the band gap of the specifically designed semiconductor material with respect to the work function of the metal-containing gate electrode material, thereby obtaining the desired low threshold voltage of the transistor under consideration. Typically, a corresponding specifically designed semiconductor material, such as silicon/germanium and the like, may be provided in the form of an epitaxial growth technique, which may also present an additional complex process step, which, however, may provide reduced overall process complexity compared to the provision of the different metal-containing gate electrode materials or which may provide increased flexibility in obtaining appropriate transistor characteristics. Since the additional epitaxial growth process may represent significant effort in terms of throughput and cycle time and thus manufacturing costs, the present disclosure relates to techniques and semiconductor devices in which additional advantages with respect to transistor performance may be obtained so as to avoid or at least reduce some of the disadvantages associated with sophisticated transistor architectures comprising high-k dielectric materials and metal-containing electrode materials.

The present disclosure is directed to various methods and devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure relates to semiconductor devices and techniques in which enhanced process flexibility may be obtained on the basis of epitaxial growth processes, which may be performed prior to forming a gate electrode structure, which, in some illustrative aspects disclosed herein, may comprise a sophisticated architecture on the basis of high-k dielectrics in combination with metal-containing materials. To this end, according to some illustrative embodiments disclosed herein, different semiconductor layers may be formed on an active region, which may provide the possibility of creating a desired type of strain in the channel region of the transistor, while also enabling an efficient adaptation of transistor characteristics, such as the threshold voltage and the like.

One illustrative method disclosed herein comprises forming a first material layer comprised of a silicon and carbon-containing semiconductor alloy on a silicon-containing crystalline semiconductor region. Additionally, the method comprises forming a second material layer comprised of silicon on the first material layer and forming a third material layer comprised of a silicon and germanium-containing semiconductor alloy on the second material layer. Finally, the method comprises forming at least a gate electrode of a P-channel transistor above the third material layer.

A further illustrative method disclosed herein comprises forming a strained silicon layer above a silicon-containing semiconductor region and forming a band gap adjusting semiconductor material on the strained silicon layer. Furthermore, the method comprises forming a gate electrode structure of a transistor on the band gap adjusting semiconductor material, wherein the gate electrode structure comprises a high-k dielectric material formed at least on the band gap adjusting semiconductor material. Furthermore, the gate electrode structure further comprises a metal-containing electrode material formed on the high-k dielectric material.

One illustrative semiconductor device disclosed herein comprises a transistor that comprises a silicon-containing semiconductor region formed above a substrate. Moreover, the transistor comprises a gate electrode structure formed above the silicon-containing semiconductor region, wherein the gate electrode structure comprises a high-k gate insulation layer and a metal-containing electrode material that is formed on the high-k gate insulation layer. Furthermore, the transistor comprises a channel region comprising a band gap adjusting semiconductor material that is in contact with the high-k gate insulation layer, while a strained silicon layer is provided in the channel region that is formed on a strain-inducing semiconductor layer.

BRIEF DESCRIPTION OF THE DRAWINGS

The disclosure may be understood by reference to the following description taken in conjunction with the accompanying drawings, in which like reference numerals identify like elements, and in which.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the present disclosure provides semiconductor devices and techniques in which epitaxial growth techniques may be applied at an early manufacturing stage, i.e., prior to forming corresponding gate electrode structures, in order to adjust the overall transistor characteristics of sophisticated devices while at the same time providing the possibility of enhancing performance of at least one type of transistor, for instance, by forming a strain-inducing semiconductor material during the epitaxial growth sequence in order to obtain a desired type of strain in the channel region of the transistor under consideration. For instance, as previously explained, in sophisticated approaches, the band gap of the semiconductor material that is in direct contact with the gate insulation layer may be adapted in view of the work function of a metal-containing electrode material, thereby requiring specifically designed semiconductor materials, such as silicon/germanium, that have a reduced band gap energy compared to silicon. For example, on the basis of a silicon/germanium alloy, the threshold voltage of P-channel transistors may be appropriately adjusted with respect to the metal-containing electrode material, while at the same time an appropriate sequence of semiconductor materials may be provided during the epitaxial growth process, which may additionally enable creation of a desired moderately high compressive strain. Thus, in addition to overall enhanced performance obtained by the sophisticated gate electrode structure, also a basic strain component may be obtained in the channel region of the transistor, which may result in an increased charge carrier mobility. As is well known, the creation of strain in a silicon-based semiconductor material may modify the charge carrier mobility, wherein, for standard crystallographic conditions in a silicon-based material, a compressive strain may result in an increase of mobility of holes, while a tensile strain component may provide enhanced electron mobility and thus drive current of the corresponding transistor. Thus, by providing one or more strain-inducing mechanisms, performance of N-channel transistors and/or P-channel transistors may be significantly enhanced, wherein, at the same time, the epitaxial growth process required for adjusting the electronic characteristics at the interface between the gate dielectric and the channel region may be advantageously used for providing an additional strain-inducing mechanism, at least for one type of transistor. In some illustrative embodiments disclosed herein, a stack of layers may be formed in a highly efficient epitaxial growth process, wherein the stack may comprise a first material layer that represents a strain-inducing material on which a corresponding silicon material may be grown in a strained state, thereby providing the desired type of strain in the channel region still to be formed, while a subsequent layer may be used as a "band gap adjusting layer" in which the material composition is selected so as to obtain the desired band gap corresponding to the work function of the sophisticated gate electrode material to be formed above the layer stack. For instance, for P-channel transistors, the band gap adjusting material may be provided in the form of a silicon/germanium alloy, thereby obtaining the desired low threshold voltage in combination with the gate electrode material under consideration, while the strain-inducing semiconductor material may be provided in the form of a silicon/carbon material. In some illustrative embodiments, these materials may be formed in the same deposition chamber or at least in the same deposition tool without requiring intermediate transport activities, thereby providing a highly efficient overall manufacturing flow. For example, the layers may be formed in situ without interrupting the corresponding low pressure or vacuum condition by simply changing the supply of precursor gases in order to obtain the desired configuration of the layer stack, wherein, if desired, a gradual transition from one material to another may even be obtained by appropriately controlling the gas flow rates. Thus, a high degree of flexibility in adjusting the overall transistor performance may be accomplished without unduly contributing to process complexity compared to approaches in which a band gap adjusting material may be provided.

Figure 1A:
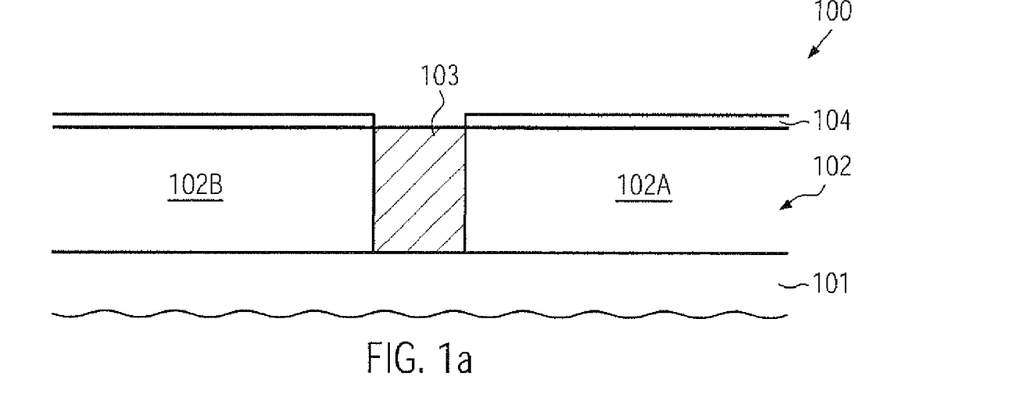
FIGS. 1a-1c schematically illustrate cross-sectional views of a semiconductor device during various manufacturing stages in forming a plurality of semiconductor materials on corresponding active regions in order to selectively adjust band gap characteristics and the strain in one of the active regions, according to illustrative embodiments.

FIG. 1a schematically illustrates a cross-sectional view of a semiconductor device 100 at an early manufacturing stage. As illustrated, the device 100 may comprise a substrate 101, which may represent any appropriate carrier material for forming thereabove a silicon-containing semiconductor layer 102. For example, the substrate 101 may represent a silicon substrate, an insulating carrier material and the like. Furthermore, the device 100 may comprise a buried insulating layer (not shown), at least in specific areas of the semiconductor device 100, when a silicon-on-insulator (SOI) configuration is required. In the manufacturing stage shown, the semiconductor layer 102 may comprise a first semiconductor region 102A, which may also be referred to as an active region and which is to be understood as a substantially crystalline semiconductor region, in which appropriate dopant profiles may be formed in order to obtain at least one PN junction for a transistor element still to be formed. Similarly, the semiconductor layer 102 may comprise a second active or semiconductor region 1022, wherein the regions 102A, 102B may be laterally separated by an isolation structure 103, such as a shallow trench isolation and the like. Furthermore, a pad or cap layer 104, for instance comprised of silicon dioxide and the like or any native oxide layer, may be formed above the semiconductor regions 102A, 102B, depending on the overall process strategy.

The semiconductor device 100 as shown in FIG. 1a may be formed on the basis of the following processes. After dividing the semiconductor layer 102 into the regions 102A, 102B by forming the respective isolation structures 103, a corresponding basic doping may be provided, for instance by implantation and the like. In other cases, the basic dopant concentrations may be provided prior to forming the isolation structures 103. Prior to, during or after the corresponding process sequences, the cap layer 104 may be formed, for instance, in the form of a native oxide or any other material that may form during an anneal cycle for activating the dopant species previously introduced into the regions 102A, 102B. For example, in one illustrative embodiment, the semiconductor region 102A may have received a basic N-doping in order to provide a corresponding active region for a P-channel transistor. Similarly, the region 102B may have received a P-type dopant species to provide the basic transistor characteristics of an N-channel transistor.

Figure 1B:
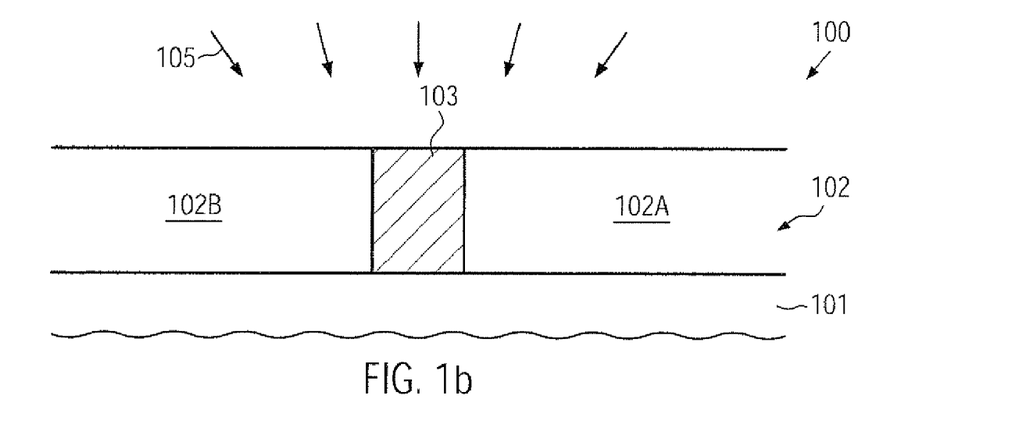

FIG. 1b schematically illustrates the semiconductor device 100 when exposed to a cleaning process 105 that may be designed to prepare the device 100 for a subsequent epitaxial growth process. For instance, the cleaning process 105 may comprise a wet chemical etch step, for instance based on diluted hydrofluoric acid (HF), in order to remove silicon dioxide material together with contaminants and the like that may have deposited on exposed surface portions during preceding manufacturing processes.

Figure 1C:
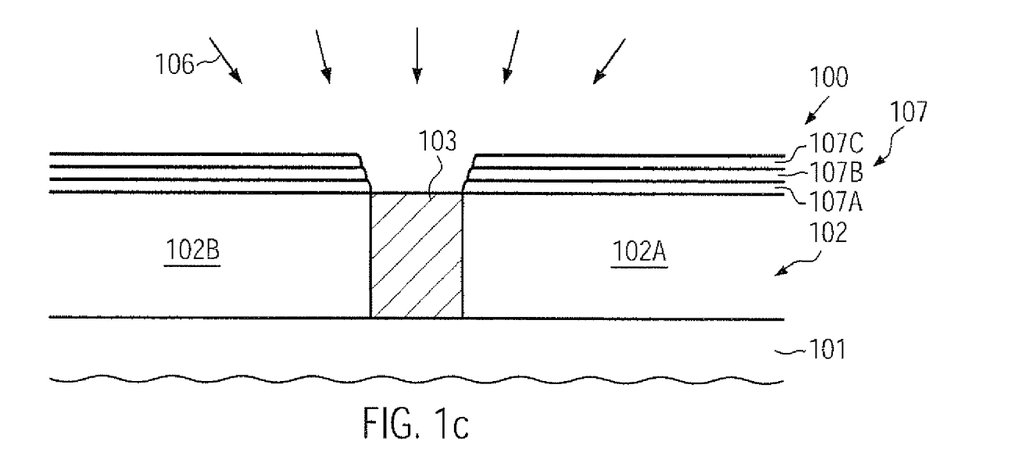

FIG. 1c schematically illustrates the semiconductor device 100 when exposed to a deposition ambient 106, which may be established in any appropriate deposition tool, which may comprise one or more process chambers for performing one or more deposition steps. For example, the deposition ambient 106 may be established on the basis of well-known process parameters to form a silicon-based material on the corresponding semiconductor regions 102A, 102B, which may act as a template material. For instance, any well-known silicon-containing precursor materials may be supplied to the deposition ambient 106, while at the same time adjusting appropriate deposition conditions, for instance, by selecting an appropriate substrate temperature in the range of approximately 500-800° C., while also supplying additional components as may be required for obtaining the desired composition of the semiconductor material to be deposited. Furthermore, as illustrated, the corresponding process parameters may, in one illustrative embodiment, be selected so as to obtain a substantially selective deposition behavior in which a significant material deposition may be substantially restricted to exposed crystalline surface areas, i.e., the semiconductor regions 102A, 102B, while material deposition on dielectric layers may be significantly reduced or may be substantially avoided. In one illustrative embodiment, the deposition ambient 106 may be appropriately adjusted so as to deposit a first material layer 107A, which may also be referred to as a strain-inducing layer, since the natural lattice constant of the material of the layer 107A may differ from the lattice constant of the material of the regions 102A, 102B, which may be provided as a silicon material. For instance, by depositing a silicon/carbon alloy as the layer 107A, a moderately high tensile strained state may be obtained, since the natural lattice constant of silicon/carbon is less compared to the lattice constant of a silicon material. Since the silicon material may act as a template for the epitaxial growth of the layer 107A, the material therein may have also the lattice constant of the template material, thereby resulting in a strained state in which the material layer 107A may have a tendency to contract. Hence, by depositing a second material layer 107B in the form of a semiconductor material having a greater natural lattice constant as the natural lattice constant of the layer 107A, the contracting forces at the surface of the layer 107A may result in a compressive stress exerted on the material layer 107B, thereby creating a compressive strain therein. Thereafter, a further material layer 107C may be formed with an appropriate composition in order to appropriately position the band gap energy with respect to the work function of a gate electrode material to be formed above the layer 107C in a later manufacturing stage. For instance, the material layer 107C may be comprised of a silicon/germanium alloy, thereby obtaining a required shift of the valence band for a plurality of well-established metal-containing gate electrode materials. As previously explained, the corresponding compositions of the layers 107A, 107B, 107C may be appropriately selected so as to obtain the desired amount of strain, such as a compressive strain, when a silicon/carbon material is provided in the layer 107A. In other cases, a silicon/germanium material, a silicon/tin material or a silicon/germanium/tin material may be provided for the layer 107A, when a corresponding tensile strain component is desired in the overlying materials 107B, 107C. For instance, tensile strain may be advantageous for N-channel transistors and, in this case, a corresponding threshold voltage adaptation by means of the layer 107C may be performed in accordance with the overall process requirements. Furthermore, as previously indicated, the deposition process 106 may be performed in a single deposition chamber without interrupting the corresponding low pressure or vacuum condition, which may be referred to herein as an in situ process, thereby providing a highly efficient overall manufacturing flow. Moreover, in this case, a gradual transition of the material composition of the stack of layers 107A, 107B, 107C, which is also referred to as layer stack 107, may be accomplished by controlling the supply of the corresponding precursor gases. In some illustrative embodiments, even a substantially continuous transition from a carbon-containing silicon material into a germanium-containing silicon material may be accomplished within the layer stack 107 so that corresponding interfaces or transitions between individual layers may be "blurred," depending on the selected process parameters. At any rate, a strain-inducing material may be formed on the semiconductor regions 102A, 102B and, at the top of the layer stack 107, a corresponding semiconductor material having the appropriate band gap or valence band position may be provided so as to adjust the corresponding threshold voltage in accordance with a gate electrode structure still to be formed. For instance, a deposition sequence in the deposition process 106 may be started with a silicon and carbon-containing precursor material, wherein the supply of the carbon-containing gas is reduced in the epitaxial growth process and is finally completely discontinued, wherein, after a more or less pronounced period or immediately after discontinuing the carbon source, the supply of a germanium-containing precursor material may be started and the corresponding concentration of the germanium in the deposition ambient 106 may be increased until a desired final concentration is obtained.

Figure 1D:
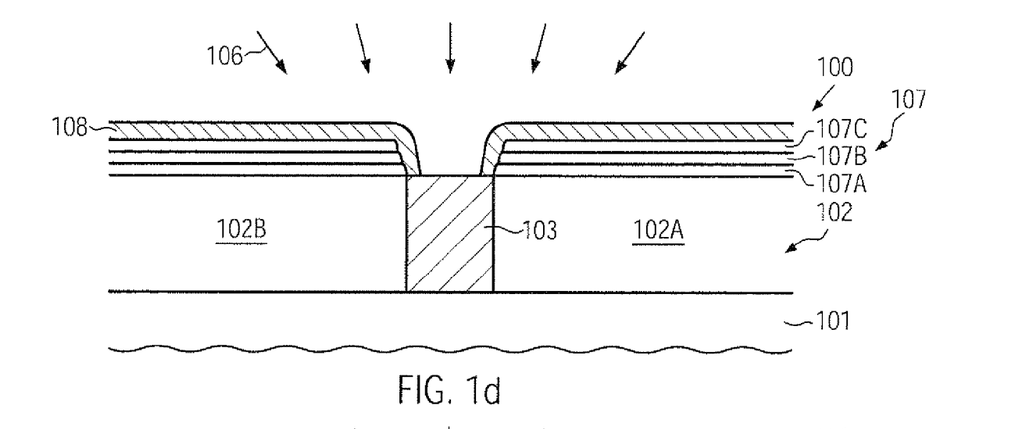
FIGS. 1d-1g schematically illustrate cross-sectional views of the semiconductor device in further advanced manufacturing stages in which the plurality of semiconductor materials may be removed from above one of the active regions, according to illustrative embodiments.

FIG. 1d schematically illustrates the semiconductor device 100 in a further advanced manufacturing stage in which a protection layer 108 is formed on exposed surface areas of at least the layer stack 107. For example, the protection layer 108 may be formed by an oxidation process, which may be accomplished by well-established techniques, such as a furnace process in an oxidizing ambient, a plasma assisted oxidation process, a wet chemical oxidation process and the like. In other illustrative embodiments, the protection layer 108 may be formed by deposition, for instance by depositing a silicon dioxide material, silicon nitride material, or any other appropriate material which may act as a hard mask material in a later manufacturing stage. It should be appreciated that, in this case, the layer 108 may also be formed on top of the isolation structure 103. In some illustrative embodiments, the protection layer 108 may be provided in the form of a high-k dielectric material, such as hafnium oxide, which may be used in the further processing and therefore corresponding process tools and deposition recipes may be available during the manufacturing flow for forming the semiconductor device 100. For instance, hafnium oxide typically has a high etch resistivity with respect to a plurality of etch recipes and may provide superior etch selectivity compared to silicon dioxide or many other well-established dielectric materials.

Figure 1E:
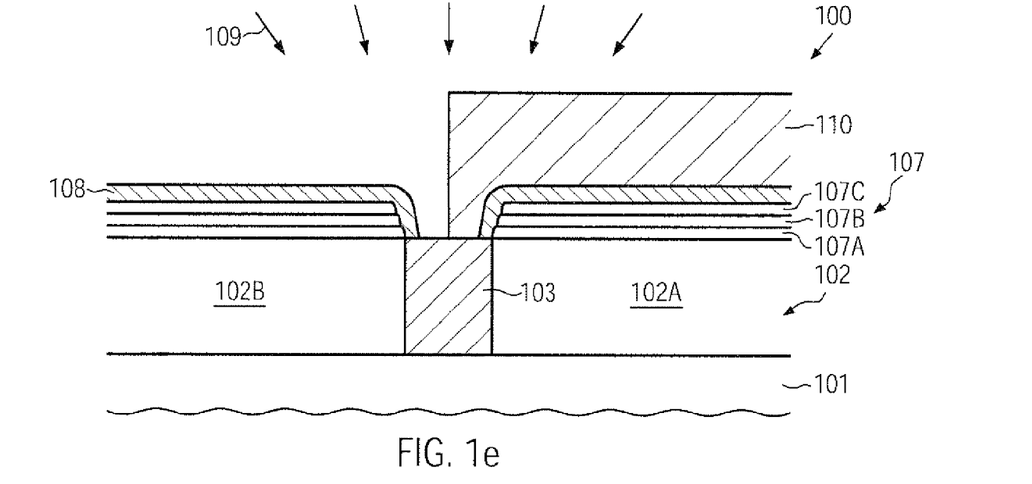

FIG. 1e schematically illustrates the semiconductor device 100 when exposed to an etch ambient 109 in order to remove an exposed portion of the protection layer 108, while an etch mask 110 may cover the layer stack 107 formed above the semiconductor region 102A. For example, the etch process 109 may be performed on the basis of hydrofluoric acid, which may efficiently remove silicon dioxide material. In other cases, any other appropriate wet chemical or dry etch recipes may be used for removing the protection layer 108.

Figure 1F:
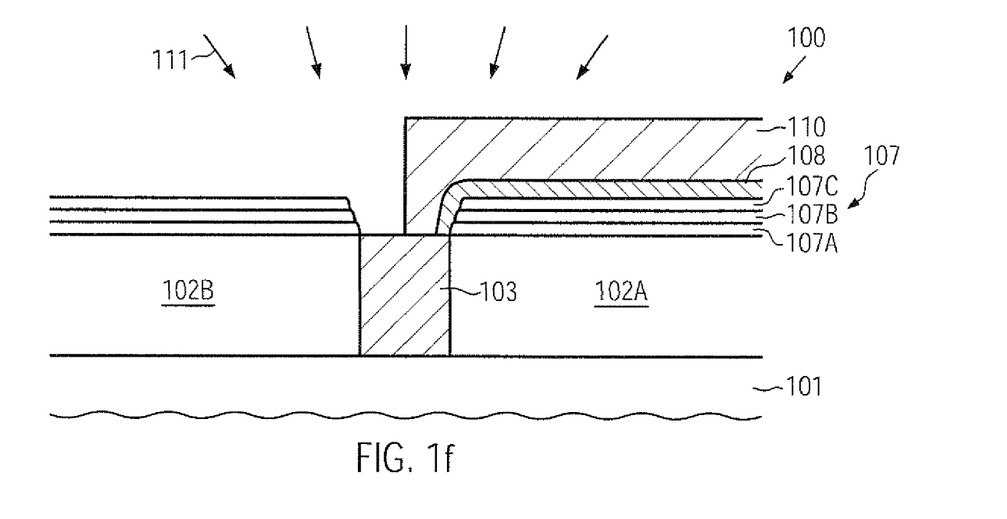

FIG. 1f schematically illustrates the device 100 during a further etch process 111 that is designed to remove the etch mask 110 and/or the exposed portion of the layer stack 107, while the protection layer 108, possibly in combination with the resist mask 110, at least at an initial phase of the process 111, may protect the layer stack 107 above the semiconductor region 102A. It should be appreciated that a plurality of wet chemical etch recipes are available to remove the etch mask 110 and also the semiconductor materials of the layer stack 107. For example, tetra methyl ammonium hydroxide (TMAH) may be used, which may remove resist material and may also etch silicon-based materials at elevated temperatures and at a corresponding high concentration. On the other hand, TMAH may exhibit a high selectivity with respect to silicon dioxide and silicon nitride. Consequently, the exposed portion of the layer stack 107 may be removed in a highly controllable manner so as to not unduly remove material of the region 102B, while at the same time the protection layer 108 may reliably maintain integrity of the layer stack 107 above the semiconductor region 102A.

Figure 1G:
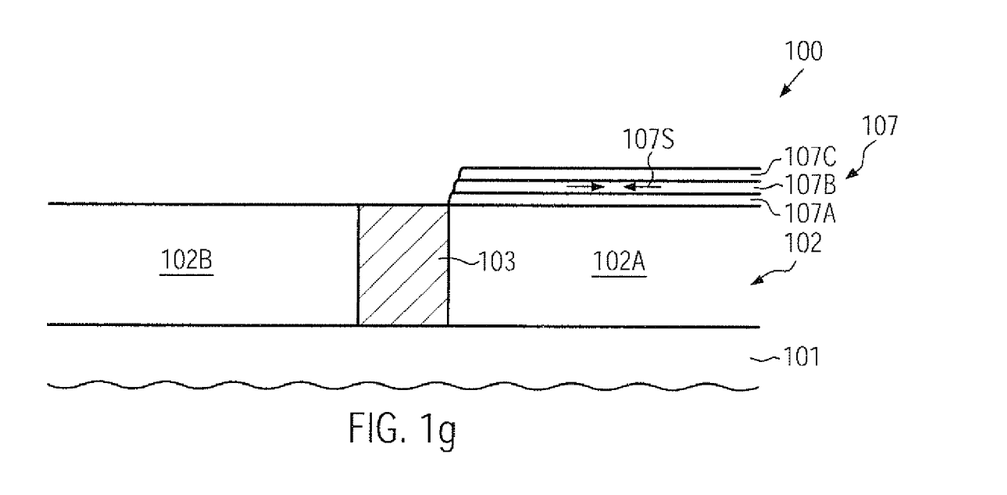

FIG. 1g schematically illustrates the semiconductor device 100 in a further advanced manufacturing stage. As illustrated, the layer stack 107 may be exposed above the semiconductor region 102A, while the materials of the layer stack 107 may be substantially completely removed from above the semiconductor region 102B, which may be accomplished during the etch process 111 (FIG. 1f). On the other hand, the protection layer 108 (FIG. 1f) may be removed on the basis of well-established recipes, such as an etch step using hydrofluoric acid and the like. In this state, the semiconductor device 100 may be prepared for receiving an appropriate gate electrode structure, which may comprise a high-k dielectric material in combination with a metal-containing electrode material, as is also previously explained. Consequently, a corresponding strain component 107S, such as a compressive strain component, may be present in a significant portion of the layer stack 107, that is, in the layer 107B and to a certain degree in the layer 107C, thereby increasing mobility of holes, as previously explained. Thus, upon forming a gate electrode structure on the layer stack 107, the strain component 107S may act within a corresponding channel region of the transistor device, thereby enhancing charge carrier mobility therein and thus providing enhanced drive current and switching speed. For the above-described configuration of the layers 107A, 107B and 107C, a silicon/carbon alloy, a silicon material followed by a silicon/germanium alloy, a compressive strain component may be obtained. In other cases, a tensile strain component may be achieved by providing the layer 107A in the form of a semiconductor material having a greater natural lattice constant compared to the materials in the region 102A and in the layer 107B. Consequently, the semiconductor device 100 as shown in FIG. 1g may be prepared for forming sophisticated gate electrode structures.

Figure 1H:
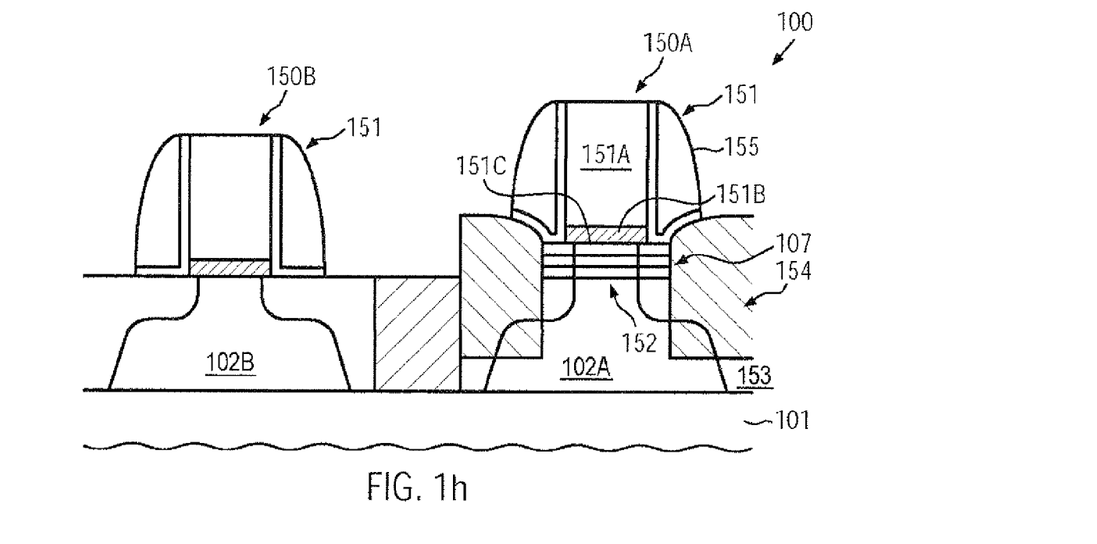
FIG. 1h schematically illustrates the semiconductor device in a further advanced manufacturing stage in which the basic transistor configurations are completed on the basis of a sophisticated gate electrode structure, according to illustrative embodiments.

FIG. 1h schematically illustrates the semiconductor device 100 in a further advanced manufacturing stage. As illustrated, a first transistor 150A may be formed in and above the semiconductor region 102A and may comprise a gate electrode structure 151 comprising a gate insulation layer 151B that may be formed on the layer stack 107, or at least a portion thereof, so as to define an interface 151C. Moreover, the gate electrode structure 151 may comprise a metal-containing gate electrode material 151A, which may be formed on the gate insulation layer 151B, wherein the layer stack 107, i.e., the layer 107C (FIG. 1g), at least at the interface 151C, may provide the desired adaptation of the valence band with respect to the work function of the material 151A, so as to obtain the desired threshold voltage, as previously explained. For example, the gate electrode material 151A may be provided in the form of a titanium-containing material, while the high-k dielectric material 151B may be comprised of hafnium oxide and the like, as is also previously explained. Thus, at least a portion of the layer stack 107 may act as a channel region 152, wherein the strain component 107S (FIG. 1g) may thus provide enhanced charge carrier mobility. In some illustrative embodiments additional strain-inducing forces may be implemented in the transistor 150A, for instance in the form of an embedded semiconductor alloy 154, such as a silicon/germanium alloy, when the transistor 150A represents a P-channel transistor. Moreover, the transistor 150A may comprise a sidewall spacer structure 155 formed on sidewalls of the gate electrode structure 151, wherein the spacer structure 155 may be used to define a dopant profile of drain and source regions 153 formed in the semiconductor region 102A and possibly in a portion of the layer stack 107, depending on the overall device requirements. In other cases, the dopant profile for the drain and source regions 153 may be obtained on the basis of in situ doping of the material 154, if provided, thereby reducing implantation-induced damage and thus strain relaxation in the vicinity of the channel region 152.

In the embodiment shown, the semiconductor device 100 may further comprise a second transistor 150B, such as an N-channel transistor, which may have a gate electrode structure 151, wherein the gate electrode material 151A may be adapted with its work function to the electronic characteristics of the semiconductor region 102B so as to obtain a desired threshold voltage. The semiconductor device 100 as shown in FIG. 1h may be formed on the basis of well-established manufacturing techniques, for instance including the deposition of the high-k dielectric gate material, followed by forming an appropriate gate electrode material, possibly in the form of a place holder material, which may be replaced in a later manufacturing stage, depending on the overall process strategy. Thus, after patterning the gate electrode material or the corresponding place holder material, the drain and source regions 153 may be formed on the basis of the spacer structure 155 depending on the overall device requirements. It should be appreciated that, at any appropriate manufacturing stage, the semiconductor alloy 154 may be formed, for instance, by forming corresponding cavities in the semiconductor region 102A and the layer stack 107 and epitaxially growing a corresponding strain-inducing material. For this purpose, well-established process techniques may be used. Furthermore, at any appropriate manufacturing stage, a corresponding place holder material, such as polysilicon, may be replaced by the gate electrode material 151A, if the material 151A is not compatible with process techniques used for forming the basic transistor configuration, which may include any high temperature processes, such as annealing processes for activating dopants and re-crystallizing implantation-induced damage.

Consequently, the transistors 150A, 150B may receive a sophisticated gate electrode structure 151, wherein the threshold voltage may be efficiently adjusted on the basis of providing an appropriate band gap adjusting material, such as the layer 107C, while at the same time the overall charge carrier mobility in the channel region 152 of the transistor 150a may be enhanced by providing a corresponding strain inducing material. Thus, the corresponding epitaxial growth process sequence may be concurrently used for threshold voltage adaptation and providing a strain-inducing mechanism, thereby compensating for or even over compensating for any additional process complexity that may be introduced by the early epitaxial growth process.

Figure 1I:
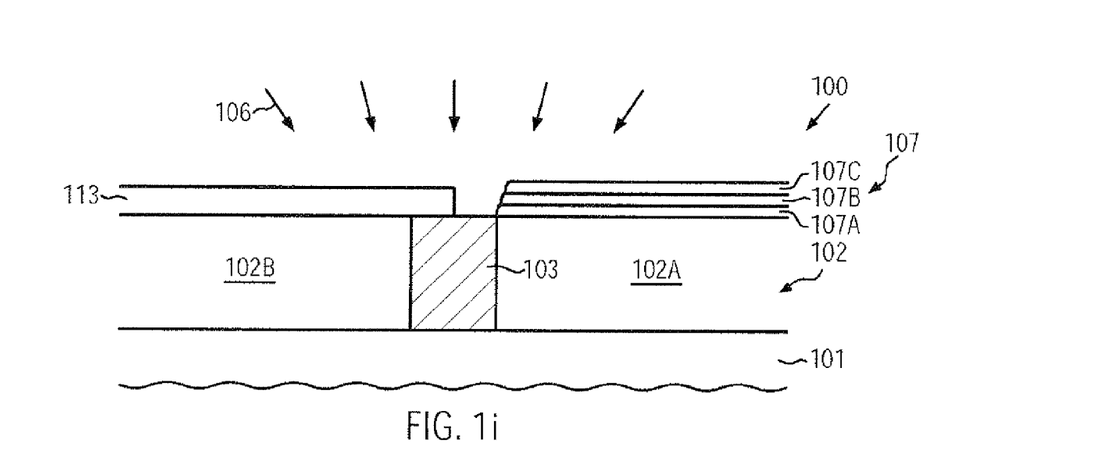
FIG. 1i schematically illustrates the semiconductor device in a manufacturing stage in which appropriate semiconductor materials, such as a strain-inducing semiconductor material and a band gap adjusting material, may be selectively formed on the basis of epitaxial growth techniques, according to still further illustrative embodiments.

FIG. 1i schematically illustrates the semiconductor device 100, in which the epitaxial growth process 106 may be performed on the basis of a growth mask 113, which may be provided in the form of any appropriate dielectric material, such as silicon nitride, silicon dioxide and the like. In this case, the layer stack 107 may be formed during the process sequence 106, as previously described, while the mask 113 may be selectively removed by well-established wet chemical etch recipes without significantly affecting the layer stack 107. After the removal of the growth mask 113, the processing may be continued as previously described.

As a result, the present disclosure provides techniques and semiconductor devices in which enhanced flexibility in adjusting transistor characteristics may be obtained in a process sequence in which a sophisticated gate electrode structure is also to be provided. For this purpose, epitaxial growth processes may be used for adapting the threshold voltage of at least one type of transistor, while also providing a desired type of strain in the channel region.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A method, comprising:
    forming a first material layer made of silicon-carbon on a silicon-containing crystalline semiconductor region;
    forming a second material layer made of silicon on said first material layer;
    forming a third material layer made of silicon-germanium on said second material layer; and
    forming at least a gate electrode of a P-channel transistor above said third material layer.

2. The method of claim 1, wherein forming at least said gate electrode comprises forming a gate dielectric layer on said third material layer and forming a metal-containing electrode on said gate dielectric layer.

3. The method of claim 2, wherein said gate dielectric layer comprises a dielectric material having a dielectric constant of approximately 10 or higher.

4. The method of claim 1, wherein said first, second and third material layers are formed in situ in a deposition ambient without interrupting a low pressure condition of said deposition ambient.

5. The method of claim 1, wherein a germanium concentration of said third material layer is lowest at an interface between said second and third material layers and increases with increasing thickness of said third material layer.

6. The method of claim 1, wherein a carbon concentration of said first material layer is lowest at an interface between said first and second material layers.

7. The method of claim 1, further comprising forming at least one of said first, second and third material layers on said silicon-containing semiconductor region and on a second silicon-containing semiconductor region in a common deposition process and selectively removing at least one of said first, second and third material layers from above said second silicon-containing semiconductor region.

8. The method of claim 7, wherein each of said first, second and third material layers is formed above said silicon-containing semiconductor region and above said second silicon-containing semiconductor region.

9. The method of claim 7, further comprising forming an N-channel transistor in and above said second silicon-containing semiconductor region.

10. The method of claim 1, further comprising forming a hard mask material above a second silicon-containing semiconductor region, wherein said first, second and third material layers are formed selectively above said silicon-containing semiconductor region.

11. A method, comprising:
forming a first material layer made of silicon-carbon on a silicon-containing crystalline semiconductor region;
forming a second material layer made of silicon on said first material layer;
forming a third material layer made of silicon-germanium on said second material layer, wherein said first, second and third material layers are formed in situ in a deposition ambient without interrupting a low pressure condition of said deposition ambient and wherein a germanium concentration of said third material layer is lowest at an interface between said second and third material layers and increases with increasing thickness of said third material layer; and
forming at least a gate electrode of a P-channel transistor above said third material layer.

12. The method of claim 11, wherein a carbon concentration of said first material layer is lowest at an interface between said first and second material layers.

* * * * *